United States Patent
Choi et al.

(10) Patent No.: US 11,410,737 B2
(45) Date of Patent: Aug. 9, 2022

(54) POWER REGULATION FOR MEMORY SYSTEMS

(71) Applicant: Micron Technology, Inc., Boise, ID (US)

(72) Inventors: Baekkyu Choi, San Jose, CA (US); Fuad Badrieh, Boise, ID (US); Thomas H. Kinsley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 7 days.

(21) Appl. No.: 16/740,275

(22) Filed: Jan. 10, 2020

(65) Prior Publication Data

US 2021/0217482 A1    Jul. 15, 2021

(51) Int. Cl.
*G11C 16/30* (2006.01)
*G11C 5/14* (2006.01)

(52) U.S. Cl.
CPC .............. *G11C 16/30* (2013.01); *G11C 5/145* (2013.01); *G11C 5/147* (2013.01)

(58) Field of Classification Search
CPC ................................ G11C 16/30; G11C 5/147
See application file for complete search history.

(56) References Cited

U.S. PATENT DOCUMENTS

| | | | |
|---|---|---|---|
| 10,395,721 B1 * | 8/2019 | Prather | G11C 11/4074 |
| 2006/0139983 A1 | 6/2006 | Sprietsma et al. | |
| 2007/0242549 A1 | 10/2007 | Klostermann et al. | |
| 2008/0106950 A1 | 5/2008 | Lee et al. | |
| 2011/0161748 A1 | 6/2011 | Casper et al. | |
| 2015/0160718 A1 * | 6/2015 | Cui | G06F 11/07 713/320 |
| 2016/0012865 A1 * | 1/2016 | Lee | G11C 5/04 365/51 |
| 2019/0237124 A1 * | 8/2019 | Cha | G11C 5/14 |
| 2019/0259428 A1 * | 8/2019 | Choi | G11C 8/08 |
| 2019/0267071 A1 | 8/2019 | Prather et al. | |
| 2019/0279687 A1 * | 9/2019 | Lee | G11C 5/147 |
| 2020/0185041 A1 * | 6/2020 | Baek | G11C 16/30 |

OTHER PUBLICATIONS

ISA/KR, International Search Report and Written Opinion of the International Searching Authority, Int'l Appl. No. PCT/US2020/067184, dated Apr. 16, 2021, Korean Intellectual Property Office, SeoOgu, Daejeon, Republic of Korea, 10 pgs.

* cited by examiner

*Primary Examiner* — Tuan T Nguyen
(74) *Attorney, Agent, or Firm* — Holland & Hart LLP

(57) ABSTRACT

Methods, systems, and devices for power regulation for memory systems are described. In one example, a memory system, such as a memory module, may include a substrate, and an input/output component coupled with the substrate and operable to communicate signals with a host system. The memory system may also include one or more memory devices coupled with the substrate and the input/output component and operable to store data for the host system. A memory device of the one or more memory devices may include a power management component in its package with one or more memory dies. The power management component may be coupled with the one or more memory dies, and feedback component, and may be operable to provide one or more supply voltages for the one or more memory dies based on one or more voltages associated with the memory system.

21 Claims, 5 Drawing Sheets

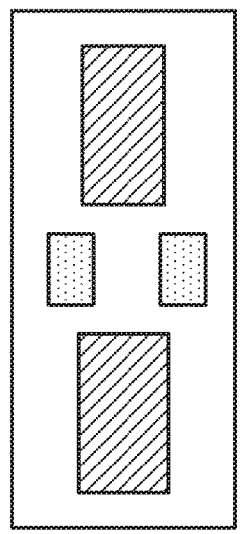
FIG. 3A — 300
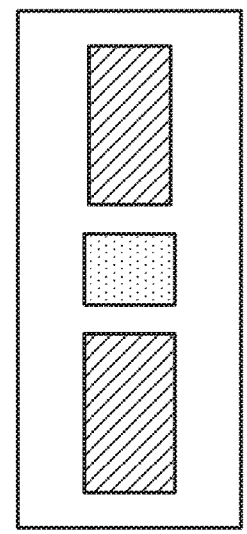
FIG. 3B — 301
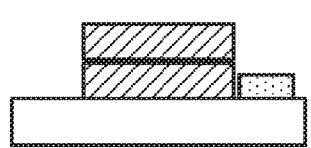
FIG. 3C — 302
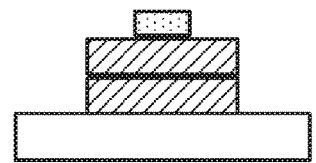
FIG. 3D — 303
 Substrate, 305
 Memory Die, 310
 Power management component, 315

POWER REGULATION FOR MEMORY SYSTEMS

BACKGROUND

The following relates generally to one or more memory systems and more specifically to power regulation for memory systems.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random-access memory (RAM), read-only memory (ROM), dynamic RAM (DRAM), synchronous DRAM (SDRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

BRIEF DESCRIPTION OF THE DRAWINGS

FIG. 3A-3D illustrate example of memory devices that support power regulation for memory systems in accordance with examples as disclosed herein.

DETAILED DESCRIPTION

A memory system may include one or more memory devices coupled with a power management component, for example a power management integrated circuit (PMIC), to supply different voltages to the one or more memory devices. The power management component may provide supply voltages that the one or more memory device use to access memory cells of the one or more memory devices. For example, a power management component may regulate voltage to each memory device on a dual in-line memory module (DIMM). In some cases, a DIMM may include a power management component, and one or more packages, where each package may contain at least one memory device. The power management component may be connected to each package via channels.

When providing supply voltages centrally on the memory module and distributing the supply voltages to each memory device using channels, the voltage from the power management component experienced at each memory device may be different than expected (e.g., because of the varying distances from the power management component amongst other reasons). In some cases, a memory device may operate at low voltages (e.g., 1.1 to 0.9V) and high frequencies. As such, it may be beneficial to mitigate noise and loss of power, voltages, or current, or a combination thereof between the power management component and the memory devices of a package.

To reduce noise and power loss associated with the supply voltages used by the one or more memory devices of a memory system, more than one power management component may be incorporated on the memory system. In some cases, there may be at least one power management component incorporated into each memory device. For example, in a dynamic random-access memory (DRAM) DIMM, each DRAM may have a PMIC packaged with the memory dies or otherwise incorporated into the DRAM so that the DIMM includes a one to one ratio of DRAM chips and PMICs. Because at least one management component is part of each memory device, the supply voltage seen by each memory device may have reduced noise and power loss. In some cases, a feedback component may be implemented in each memory device with the power management component to allow for tighter tolerances of the supply voltages seen by the memory devices.

Features of the disclosure are initially described in the context of memory systems and memory dies as described with reference to FIGS. 1 and 2. Features of the disclosure are described in the context of systems with various configurations of power management components as described with reference to FIGS. 2-3D. These and other features of the disclosure are further illustrated by and described with reference to an apparatus diagram and a flowchart that relate to power regulation for memory systems as described with references to FIGS. 4 and 5.

Figure 1:
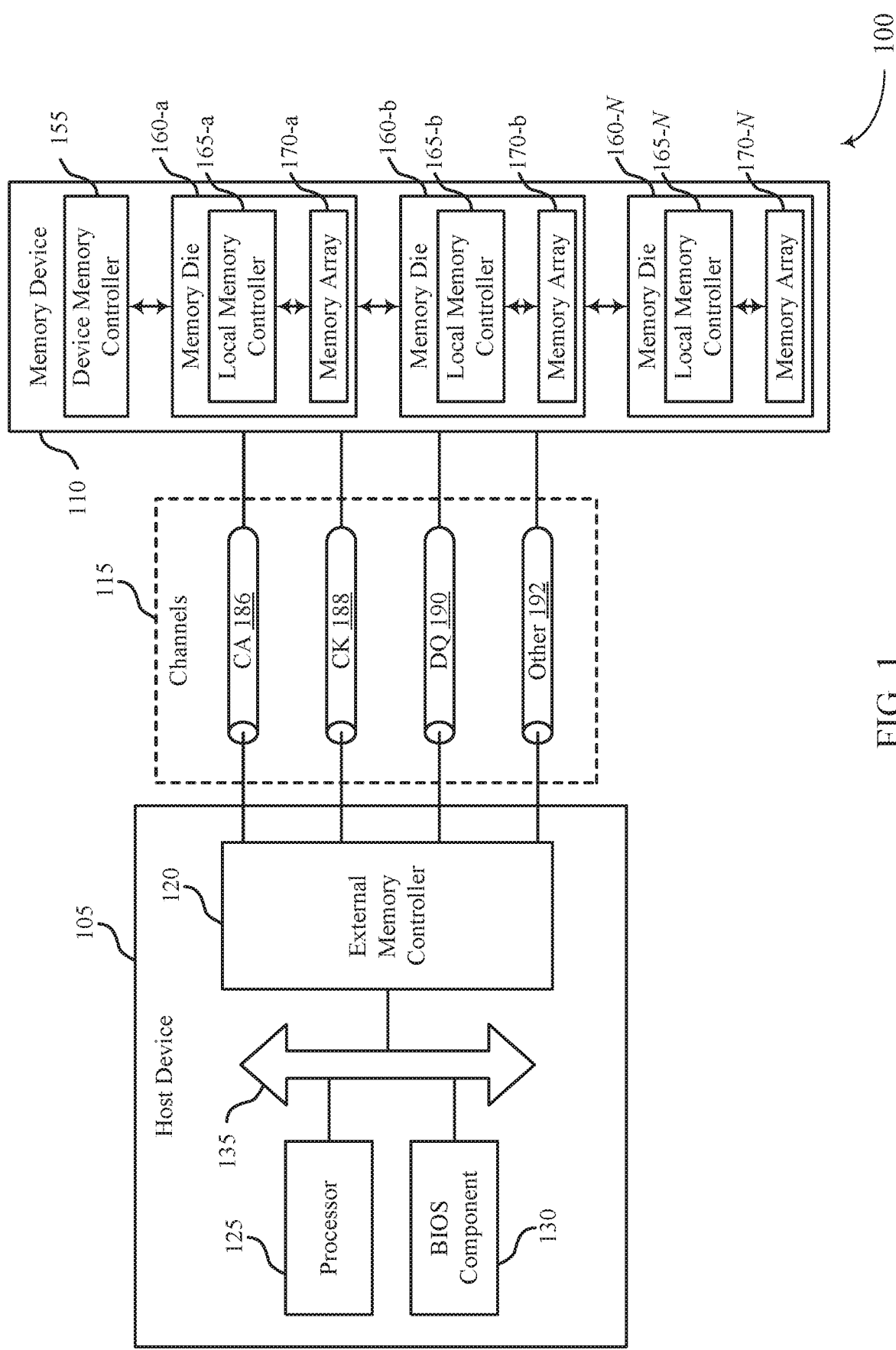
FIG. 1 illustrates an example of a system that supports power regulation for memory systems in accordance with examples as disclosed herein.

FIG. 1 illustrates an example of a system 100 that utilizes one or more memory devices in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105. In some cases, the host device 105 may refer to a memory system such as a DIMM.

A memory device 110 may be an independent device or a component that is operable to provide physical memory addresses/space that may be used or referenced by the system 100. In some examples, a memory device 110 may refer to a package, or a DRAM device. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output (I/O) controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some cases, the system 100 may refer to a single in-line memory module (SIMM), DIMM, or other type of module or assembly. In some examples, the system 100 or the host device 105 may include various peripheral components. The peripheral components may be any input device or output device, or an interface for such devices, that may be integrated into or with the system 100 or the host device 105. Examples may include one or more of: a disk controller, a sound controller, a graphics controller, an Ethernet controller, a modem, a universal serial bus (USB) controller, a serial or parallel port, or a peripheral card slot such as peripheral component interconnect (PCI) or specialized graphics ports. The peripheral component(s) may be other components understood by a person having ordinary skill in the art as a peripheral.

In some examples, the system 100 or the host device 105 may include an I/O controller. An I/O controller may manage data communication between the processor 125 and the peripheral component(s), input devices, or output devices. The I/O controller may manage peripherals that are not integrated into or with the system 100 or the host device 105. In some examples, the I/O controller may represent a physical connection or port to external peripheral components.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The memory die 160 may be an example of a two-dimensional (2D) array of memory cells or may be an example of a three-dimensional (3D) array of memory cells. A 2D memory die 160 may include a single memory array 170. A 3D memory die 160 may include two or more memory arrays 170, which may be stacked on top of one another or positioned next to one another (e.g., relative to a substrate). In some examples, memory arrays 170 in a 3D memory die 160 may be referred to as decks, levels, layers, or dies. A 3D memory dies 160 may include any quantity of stacked memory arrays 170 (e.g., two high, three high, four high, five high, six high, seven high, eight high). In some 3D memory dies 160, different decks may share at least one common access line such that some decks may share one or more of a word line, a digit line, or a plate line.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, the channels 115 may include one or more CA channels 186. The CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any quantity of signal paths to decode one or more of address or command data (e.g., eight or nine signal paths).

In some examples, the channels 115 may include one or more clock signal channels 188 (e.g., CK channels). The clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, the channels 115 may include one or more data (DQ) channels 190. The data channels 190 may be operable to communicate one or more of data or control information between the host device 105 and the memory device 110. For example, the data channels 190 may communicate information (e.g., bi-directional) to be written to the memory device 110 or information read from the memory device 110.

The channels 115 may include any quantity of signal paths (including a single signal path). In some examples, a channel 115 may include multiple individual signal paths. For example, a channel may be x4 (e.g., including four signal paths), x8 (e.g., including eight signal paths), x16 (including sixteen signal paths), etc.

In some examples, the one or more other channels 192 may include one or more error detection code (EDC) channels. The EDC channels may be operable to communicate error detection signals, such as checksums, to improve system reliability. An EDC channel may include any quantity of signal paths.

Signals communicated over the channels 115 may be modulated using one or more different modulation schemes. In some examples, a binary-symbol (or binary-level) modulation scheme may be used to modulate signals communicated between the host device 105 and the memory device 110. A binary-symbol modulation scheme may be an example of a M-ary modulation scheme where M is equal to two. Each symbol of a binary-symbol modulation scheme may be operable to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

Some systems may include a power management component coupled with one or more memory devices to regulate the voltage at the memory devices. In some traditional systems, there may be one power management component per memory system (e.g., DIMM), which may create variations in the supply voltages seen by the one or more memory devices of the memory system. It may be beneficial incorporate more than one power management component per memory system. In some cases, each memory device (e.g., DRAM device or package) containing one or more memory dies may include a power management component.

In some implementations, a power management component may be incorporated into a package of a memory device that includes one or more memory dies and may support power to multiple memory dies on a substrate associated with the package. For example, a power management component (e.g., PMIC) may control the flow and direction of electrical power on a memory system (e.g., DIMM) to one or more memory devices. In some cases, a memory device (e.g., DRAM such as a double data rate 5 (DDR5) RAM) may be coupled with a voltage regulator in a PMIC and may operate at low voltages and high frequencies. A memory device that operates at such operation conditions may experience noise and loss of power, voltage, or current from the PMIC.

There may be different variations to incorporate a power management component into a package. In some cases, a package may include one or more memory dies and one power management component. In some cases, a package may include one or more memory dies and more than one power management components. The power management component may be placed on a substrate next to a memory die or may be positioned on top of a memory die, or a combination thereof.

Figure 2:
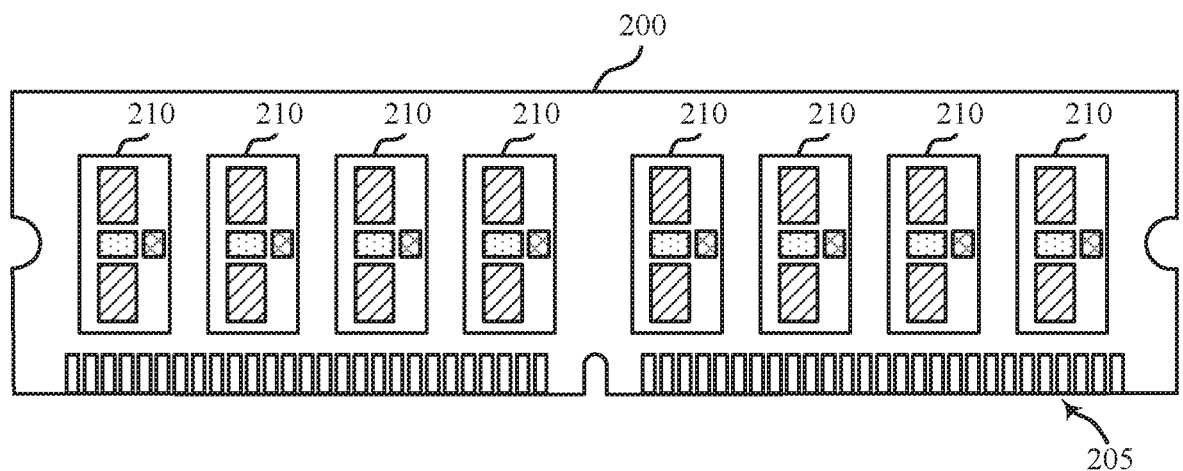
FIG. 2 illustrates an example of a memory system that supports power regulation for memory systems in accordance with examples as disclosed herein.

FIG. 2 illustrates an example of a memory system 200 that supports power regulation for memory systems in accordance with examples as disclosed herein. The memory system 200, and one or more memory devices 210 that may include one or more memory dies 215, one or more power management components 220, and one or more feedback components 225. The memory dies 215, power management components 220, and feedback components 225 of a memory device 210 may be connected via channels. The memory system 200 may be associated with the memory device 110 as described with reference to FIG. 1.

Memory system 200 may include a DIMM, a SIMM, or other type of module of assembly. For example, memory system 200 may be an example of a DIMM. In some examples, memory system 200 may include pins, sockets, connectors, or other terminals that support an electrical connection, where such terminals may support physically separable connections, assemblies, or installations. In some examples, a memory system 200 may include electrical contacts that support the memory system 200 being separately manufactured, and then installed permanently, semi-permanently, or temporarily. The memory system 200 may be manufactured according to various form factors, and one memory system may have a different form factor than another memory system.

The memory system 200 may a substrate, such as silicon, germanium, silicon-germanium alloy, gallium arsenide, gallium nitride, etc. type of substrate, on which other components (e.g., memory devices) are positioned. In some cases, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means. In some cases, the substrate may include one or more locations (e.g., sockets or connectors) to couple with memory devices 210.

The memory system 200 may include an I/O component 205. An I/O component 205 may manage data communication between a processor and peripheral component(s), input devices, or output devices. The I/O component 205 may manage peripherals that are not integrated into or with the memory system 200 or a host device. In some examples, the I/O component 205 represents a physical connection or port to external peripheral components. In some cases, the I/O component 205 may be coupled with a ball grid array (BGA) and the I/O component may communicate signals with a host device via the BGA. A BGA a type of surface-mount packaging (e.g., a chip carrier) used for integrated circuits and may be used to mount devices. A BGA may enable high density connections to be made more easily to integrated circuits because a BGA may provide more interconnection pins that may be put on a dual in-line or flat package.

The memory system 200 may include one or more memory devices 210 (e.g., DRAM devices or packages) that may include one or more memory dies 215, one or more power management components 220, one or more feedback components 225, or a substrate, or a combination thereof. The memory die 215 may include one or more memory cells that may each be programmable to store different logic states (e.g., a programmed one of a set of two or more possible states). For example, a memory cell may be operable to store one bit of information at a time (e.g., a logic 0 or a logic 1). In some examples, a memory cell (e.g., a multi-level memory cell) may be operable to store more than one bit of information at a time (e.g., a logic 00, logic 01, logic 10, a logic 11). The memory die 215 may include one or more access lines (e.g., one or more word lines and one or more digit lines) arranged in a pattern, such as a grid-like pattern. An access line may be a conductive line coupled with a memory cell and may be used to perform access operations on the memory cell.

The memory cells of memory dies 215 of a memory device 210 may be DRAM memory cells. In DRAM architectures, each memory cell may include a capacitor that includes a dielectric material (e.g., an insulator) to store a charge representative of the programmable state. In some cases, a DRAM memory cell may be a volatile memory cell that may lose its stored state when disconnected from an external power source.

A memory device 210 may include a substrate where the substrate may be a structure or medium used to couple the memory dies 215 with a host device (e.g., GPU) such that signals may be exchanged between the memory dies 215 and the host device. The substrate may be an organic substrate, a high-density interposer, or a silicon interposer, or a combination thereof used to couple the memory dies 215 with a host device. The substrate may be positioned above, below, or to the side of a memory array. The substrate may not be limited to being underneath other components but may be in any configuration relative to the memory array and/or other components.

The substrate may be formed of a different types of materials. In some cases, the substrate may be an example of one or more organic substrates. A substrate may be an example of a printed circuit board that mechanically supports and/or electrically connects components. The substrate may use conductive tracks, pads and other features etched from one or more layers of a conductive material (e.g., copper) laminated onto and/or between layers of a non-conductive material. Components may be fastened (e.g., soldered) onto the substrate to both electrically connect and mechanically fasten the components. In some cases, non-conductive materials of a substrate may be formed of a variety of different materials including phenolic paper or phenolic cotton paper impregnated with resin, fiberglass impregnated with resin, metal core board, polyimide foil, Kapton, UPILEX, polyimide-fluoropolymer composite foil, Ajinomoto build-up film (ABF), or other materials, or a combination thereof.

In some systems, each memory system 200 includes a single power management component 220 (e.g., PMIC). In such systems, the power management component is connected to each memory device 210 on the memory system 200 via channels. The power management component 220 may regulate the power supplied to each memory die 215. In some cases, the power management component 220 may be a large component that may create electromagnetic radiation which may impact smaller components on the memory system 200, such as memory dies 215. To decrease the effect of electromagnetic radiation on the smaller components, the power management component 220 may be placed to the side of a memory system 200. Placing the power management component 220 to the side of the memory system 200 may cause the channels to each memory die 215 to vary in length. As such, one or more memory dies 215 may receive a voltage that is less than or greater than the intended voltage from the power management component 220 due to the variations in distances, variations in voltage reflections, variations in interference, or other variations. For example, the memory die 215 farthest from the power management component 220 may receive a voltage less than the voltage sent by the power management component 220 due to power loss from the long distance between the memory die 215 and power management component 220. In some cases, the large distances between the memory dies 215 and power management components 220 may cause noise to one or more memory dies 215. In some cases, the frequencies of the supply voltages are higher, which may make the supply voltages more susceptible to electromagnetic radiation or other noise.

To better regulate supply voltages supplied to memory devices 210, more than one power management component 220 may be incorporated on a memory system 200. In some cases, a memory system 200 includes more than one power management component 220. In some cases, at least one power management component 220 is incorporated into each memory device 210. As such each memory die 215 of a memory device 210 may be closer to a power management component 220, which may reduce noise and power loss. For example, memory device 210 of memory system 200 may include one or more memory dies 215, one or more power management components 220, and one or more feedback components 225.

The power management component 220 of the memory device 210 may be for managing power constraints of the various components of the memory device 210 including the memory devices (e.g., memory dies 215). The power management component 220 may perform one or more of the following functions: current conversion, power-source selection, voltage scaling, power sequencing, or deactivated state power control, or any combination thereof. The power management component 220 may enter a deactivated state where one or more components of the power management component 220 are deactivated so that the memory device 210 or the larger host device can conserve power.

The power management component 220 may include a supply interface, an inter-integrated circuit, logic, low-dropout regulators power supplies, and, in some cases, multitime programmable memory. The supply interface may be configured to receive a power to be run the power management component 220 and be distributed to other components of a memory device 210 (e.g., the memory dies). In some cases, the inter-integrated circuit includes a pin configured for receiving information (e.g., a serial clock) from another component. The logic may include an analog-to-digital converter, a digital-to-analog converter, an oscillator, or other components, or any combination thereof. Logic may be for providing information (e.g., feedback) to other components in a memory system.

The low-dropout regulators may be for outputting DC power to the memory devices of the memory system, including the memory die 215. In some cases, the low-dropout regulators are used to regulate an output voltage, when the output voltage is close to a supply voltage input to the power management component 220. The power supplies may be for outputting power to the memory dies 215 of the memory device 210 or other components of the memory device 210. The power supplies may be examples of switching regulators. The power management component 220 may include any quantity of low-dropout regulators (e.g., one, two, three, four, five, six, seven, eight), or may include any quantity of power supplies (e.g., one, two, three, four, five, six, seven, eight), or any quantity of both.

The substrate of the memory device 210 including one or more power management components 220 may be larger than the substrate of the memory device 210 that does not include a power management component 220. Additionally or alternatively, the substrate of the memory device 210 may remain the same size. In some cases, a memory device 210 includes multiple memory dies 215 and each may be coupled with a power management component 220. The multiple memory dies 215 may share the output from one power management component. For example, two memory dies 215 may share the peak-to-peak voltage (e.g., $V_{PP}$ voltage) from one power management component, and the output state drain power voltage (e.g., $V_{DDq}$ voltage) from another power management component.

In some cases, tight tolerances on the voltage levels of the supply voltages used by the memory devices is beneficial. A feedback component 225 may be operable to identify one or more voltage conditions on a memory die 215 or other component and cause the power management component 220 modify the voltage level of the supply voltage based on the feedback. The feedback component 225 may be coupled with a power management component 220 and one or more sensors of the memory dies 215. In some cases, the feedback component 225 may be a stand-alone component coupled with the power management component 220 and one or more sensors of the memory dies 215. In other cases, the feedback component 225 may be part of the power management component 220. The feedback component 225 may enable the power management component 220 to output the intended voltage level of a supply voltage within a target range. For example, the power management component 220 may supply a voltage to a memory die 215. The memory die 215 may be coupled with one or more sensors that may measure the voltage received by the memory die 215. The feedback component 225 may read the measurement from the sensors and transmit feedback about the measured condition to the power management component 220. For example, feedback transmitted by the feedback component 225 may include the measured values identified by the one or more sensors, an indicator of the measured values, an indicator whether a voltage level of a supply voltage is higher or lower than the target range, or an indicator that the voltage level of the supply voltage is outside of the target range, or a combination thereof.

The power management component 220 may adjust the voltage supply to the memory die 215 based on the measurement from the sensors and feedback component 225. The feedback component 225, power management component 220, and memory die 215 may be connected via channels or a circuit. Including more than one power management component 220 per memory system 200 or memory device 210 may allow the power management component 220 to control the voltage on each memory die 215 more closely. In some implementations, the channels used on the memory system 200 when the power management component 220 was coupled with the substrate of the memory system 200 may be removed.

FIG. 3A illustrates an example of a top plan view of a memory device 300 that supports power regulation for memory systems in accordance with examples as disclosed herein. Memory device 300 may include a substrate 305. The substrate 305 may include one or more memory dies 310 and one or more power management components 315. Memory device 300 may be an example of memory device 110 and memory device 210 as described with reference to FIGS. 1 and 2, respectively. In some cases, the memory device 300 may be referred to as a package.

A power management component 315 may be an example of a PMIC and may regulate the voltage to one or more memory dies 310. A package of the memory device may include a plurality of power management components 315 to implement a tighter feedback loop between power management component 315 and memory dies 310, and to decrease noise and power loss. For example, there may be one power management component 315 associated with each memory die 310 on a substrate 305. In other examples, there may be multiple memory dies 310 managed by one power management component 315. Additionally or alternatively, multiple power management components 315 may be associated with one memory die 310. In some implementations, one power management component 315 is split into one or more power management components 315. For example, the power management component 315 may include a first portion at a first location of the memory device and operable to provide a first subset of the one or more supply voltages and a second portion may be located at a second location of the memory device and operable to provide a second subset of the one or more supply voltages different than the first subset.

The one or more power management components 315 may be placed anywhere within a package. For example, two memory dies 310 and two power management components 315 may be coupled with the substrate 305. The two power management components 315 may be one power management component 315 split in two pieces. The two power management components 315 may be placed in between the two memory dies 310. In some cases, one power management component 315 may be placed to the side (e.g., left or right) of one memory die 310 and the other power management component 315 may be placed to the side of the other memory die 310. In some cases, one power management components 315 is placed at the top of the substrate 305 (e.g., above the memory die 310) and the other power management component 315 is placed below the memory die 310 on the substrate. In some implementations, each power management component 315 may be placed on a corner of the substrate 305, on the side of the substrate 305, in the center of the substrate 305, etc.

In some implementations, the power management components 315 is placed on the same or different horizontal plane (e.g., the same substrate) as the memory dies 310. In some cases, the power management components 315 are on different horizontal planes.

The components of the power management component 315 may emit electromagnetic (EM) radiation. EM radiation may interfere with sensitive components near the power management component 315 such as memory dies 310. To reduce EM radiation, EM shielding may be used to apply a shield to the power management component 315 or the components of the power management component 315. Several materials and techniques may be used to employ EM shielding. For example, a metallic mesh, metallic foil, conductive paint, air-gapping, magnetic materials, or filters (e.g., capacitors, ferrules, and grounded wires), or a combination thereof may be used to employ EM shielding.

FIG. 3B illustrates an example of a top plan view of a memory device 301 that supports power regulation for memory systems in accordance with examples as disclosed herein. Memory device 300 may include a substrate 305. The substrate 305 may include one or more memory dies 310 and one or more power management components 315. Memory device 300 may be an example of memory device 110 and memory device 210 as described with reference to FIGS. 1 and 2, respectively. In some cases, the memory device 300 may be referred to as a package.

The power management component 315 of the memory device may be a single integrated circuit in the memory device. For example, one power management component 315 may regulate the voltage of more than one memory dies 310 rather than splitting the power management component 315 into more than one component, where there may be one power management component 315 associated with each memory die 310 as is described in reference to FIG. 3A. As described with reference to FIG. 2, a power management component may regulate the voltage to one or more memory dies 310 via channels and may regulate the voltage based on feedback information from one or more feedback components and memory sensors.

For example, two memory dies 310, and one power management component 315 may be coupled with the substrate 305. The power management component 315 may be placed anywhere on the substrate 305. For example, the power management component 315 may be placed in between the two memory dies 310 such that there is an equal distance from the power management component 315 and each memory die 310. As another example, the power management component 315 may be placed on a corner of the substrate 305, on the side of the package in the center of the substrate 305, etc. The memory dies 310 and power management component 315 may be placed on the same horizontal plane or the same substrate, or may be placed on different horizontal planes or different substrates.

The components of the power management component 315 may emit EM radiation. EM radiation may interfere with sensitive components near the power management component 315 such as memory dies 310. To reduce EM radiation, EM shielding may be used to apply a shield to the power management component 315 or the components of the power management component 315. Several materials and techniques may be used to employ EM shielding. For example, a metallic mesh, metallic foil, conductive paint, air-gapping, magnetic materials, or filters (e.g., capacitors, ferrules, and grounded wires), or a combination thereof may be used to employ EM shielding.

FIG. 3C illustrates an example of a side elevation view of a memory device 302 that supports power regulation for memory systems in accordance with examples as disclosed herein. Memory device 300 may include a substrate 305. Substrate 305 may include one or more memory dies 310 and one or more power management components 315. Memory device 300 may be an example of memory device 110, memory device 210, and memory devices 300 and 301 as described with reference to FIGS. 1 through 3B, respectively. In some cases, the memory device 300 may be referred to as a package.

One or more memory dies 310, one or more power management components 315, or one or more feedback components, or a combination thereof may be coupled with a substrate 305. Substrate 305 (e.g., DRAM device) may be different than the substrate of the memory system (e.g., substrate of the DIMM), as described in reference to FIG. 2. In some cases, substrate 305 is coupled with the substrate of the memory system. In some cases, memory die 310 is coupled with substrate 305 and the power management component 315 of the memory device is coupled with substrate 305. The power management component 315 may be coupled with substrate 305 adjacent or next to the memory die 310.

Power management component 315 may be split into more than one portion, as described in relation to FIG. 3A, and each of the portions may be coupled with substrate 305 adjacent to one or more memory dies 310. In some implementations, one power management component 315 is on a single integrated circuit, as described with reference to FIG. 3B, and the power management component 315 is coupled with substrate 305 adjacent to one or more memory dies 310. For example, substrate 305 may include two memory dies 310, and one power management component 315. A first memory die 310 may be coupled with substrate 305 and a second memory die 310 may be placed on top of (e.g., coupled with) the first memory die 310. A power management component 315 may be coupled with substrate 305 adjacent to the first memory die 310.

In some implementations, substrate 305 includes a feedback component, as described in relation to FIG. 2. The feedback component may be incorporated into the one or more portions of the power management component 315. In some cases, the feedback component is a separate component from the one or more portions of the power management component 315. The separate feedback component may be coupled with substrate 305 adjacent to the to the first memory die 310 and power management components 315.

The components of the power management component 315 may emit EM radiation. EM radiation may interfere with sensitive components near the power management component 315 such as memory dies 310, or feedback component. To reduce EM radiation, EM shielding may be used to apply a shield to the power management component 315 or the components of the power management component 315. Several materials and techniques may be used to employ EM shielding. For example, a metallic mesh, metallic foil, conductive paint, air-gapping, magnetic materials, or filters (e.g., capacitors, ferrules, and grounded wires), or a combination thereof may be used to employ EM shielding.

FIG. 3D illustrates an example of a side elevation view of a memory device 303 that supports power regulation for memory systems in accordance with examples as disclosed herein. Memory device 300 may include a substrate 305. Substrate 305 may include one or more memory dies 310 and one or more power management components 315. Memory device 300 may be an example of memory device 110, memory device 210, and memory devices 300 and 301 as described with reference to FIGS. 1 through 3B, respectively. In some cases, the memory device 300 may be referred to as a package.

Substrate 305 may be different than the substrate of the memory system (e.g., substrate of the DIMM), as described in reference to FIG. 2. In some cases, substrate 305 is coupled with the substrate of the memory system. In some cases, one or more memory dies 310 are coupled with substrate 305 and the power management component 315 of the memory device is coupled with substrate 305. The power management component 315 may be coupled with a memory die 310, where the power management component 315 may be on top of or above one or more memory dies 310.

Power management component 315 may be split into more than one portion, as described in relation to FIG. 3A, and at least one of the portions, or all of the portions may be coupled with a memory die 310. In some cases, more than one portion of the power management component may be coupled to one memory die 310. In some cases, the one or more portions are coupled with different memory dies 310. In some cases, one portion of the power management component 315 is coupled with substrate 305 and another portion of the power management component 315 is coupled with a memory die 310.

In some implementations, one power management component 315 is on a single integrated circuit, as described with reference to FIG. 3B, and the power management component 315 may be coupled with a memory die 310. For example, substrate 305 may include, two memory dies 310, and one power management component 315. A first memory die 310 may be coupled with substrate 305 and a second memory die 310 may be coupled with the first memory die 310. A power management component may be coupled with the second memory die 310. In some implementations, the power management component 315 may be coupled with the first and second memory die 310, where the power management component may be placed in between the first and second memory dies 310.

In some implementations, substrate 305 includes a feedback component, as described in relation to FIG. 2. The feedback component may be incorporated into the power management component 315. In some cases, the feedback component may be a separate component from the power management component 315. The separate feedback component may be coupled with substrate 305 adjacent to the to the first memory die 310. The feedback component may be coupled with the first and second memory dies 310 and placed in between the memory dies 310. Additionally or alternatively, the feedback component may be coupled with power management component 315.

The components of the power management component 315 may emit EM radiation. EM radiation may interfere with sensitive components near the power management component 315 such as memory dies 310. To reduce EM radiation, EM shielding may be used to apply a shield to the power management component 315 or the components of the power management component 315. Several materials and techniques may be used to employ EM shielding. For example, a metallic mesh, metallic foil, conductive paint, air-gapping, magnetic materials, or filters (e.g., capacitors, ferrules, and grounded wires), or a combination thereof may be used to employ EM shielding.

Figure 4:
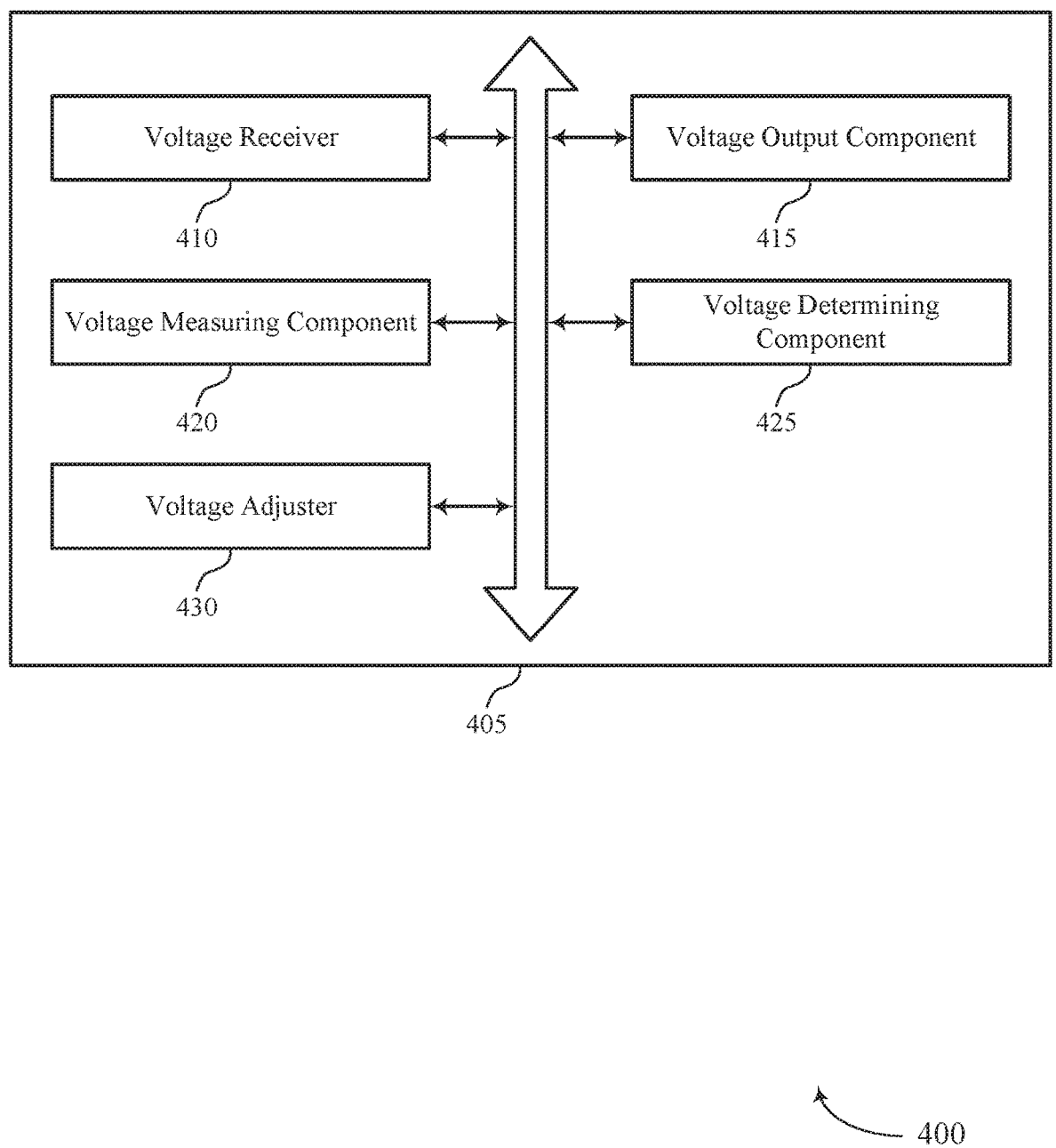
FIG. 4 shows a block diagram of a memory device that supports power regulation for memory systems in accordance with examples as disclosed herein.

FIG. 4 shows a block diagram 400 of a memory device 405 that supports power regulation for memory systems in accordance with examples as disclosed herein. The memory device 405 may be an example of aspects of a memory device as described with reference to FIGS. 2 through 3D. The functions of the memory device 405 may be implemented by one or more circuits or one or more controllers. The memory device 405 may include a voltage receiver 410, a voltage output component 415, a voltage measuring component 420, a voltage determining component 425, and a voltage adjuster 430. Each of these modules may communicate, directly or indirectly, with one another (e.g., via one or more buses).

The voltage receiver 410 may receive, by a power management component of a memory device, a first supply voltage having a first voltage level from a memory system. In some cases, the power management component is coupled with a substrate of the memory device and includes at least a portion of a package of the memory device.

The voltage output component 415 may output a second supply voltage to a memory die of the memory device based on receiving the first supply voltage, the second supply voltage having a second voltage level different than the first voltage level of the first supply voltage. In some examples, the voltage output component 415 may output the second supply voltage having a fourth voltage level different than the second voltage level based on measuring the third voltage level at the location on the memory die. In some examples, output a set of second supply voltages to the memory die of the memory device based on receiving the first supply voltage, the set of second supply voltages having one or more second voltage levels different than the first voltage level of the first supply voltage, where the set of second supply voltages includes the second supply voltage.

The voltage measuring component 420 may measure a third voltage level of the second supply voltage at a location on the memory die based on outputting the second supply voltage. In some examples, the voltage measuring component 420 may measure the third voltage level is performed by one or more sensors on the memory die of the memory device.

The voltage determining component 425 may determine the fourth voltage level of the second supply voltage based on the third voltage level, where outputting the second supply voltage having the fourth voltage level is based on determining the fourth voltage level. The voltage adjuster 430 may adjust the second voltage level of the second supply voltage to the fourth voltage level based on measuring the third voltage level, where outputting the second supply voltage having the fourth voltage level is based on adjusting the second voltage level.

Figure 5:
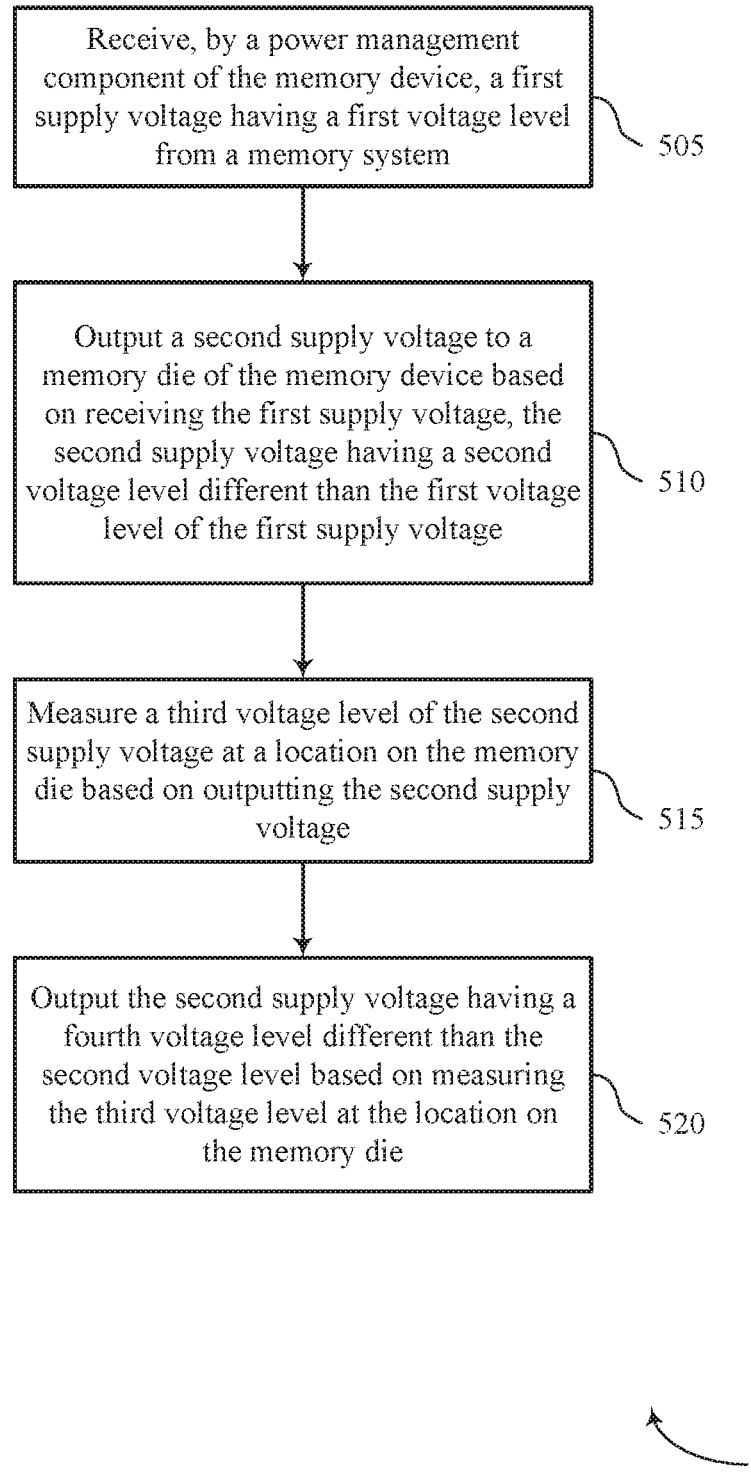
FIG. 5 shows a flowchart illustrating a method or methods that support power regulation for memory systems in accordance with examples as disclosed herein.

FIG. 5 shows a flowchart illustrating a method or methods 500 that supports power regulation for memory systems in accordance with aspects of the present disclosure. The operations of method 500 may be implemented by a memory device or its components as described herein. For example, the operations of method 500 may be performed by a memory device as described with reference to FIG. 4. The functions of the memory device may be implemented by one or more circuits or one or more controllers. In some examples, a memory device may execute a set of instructions to control the functional elements of the memory device to perform the described functions. In some cases, logic circuits or a controller of a memory device may implement the described functions of FIG. 5. Additionally or alternatively, a memory device may perform aspects of the described functions using special-purpose hardware.

At 505, the memory device may receive, by a power management component of the memory device, a first supply voltage having a first voltage level from a memory system. The operations of 505 may be performed according to the methods described herein. In some examples, aspects of the operations of 505 may be performed by a voltage receiver as described with reference to FIG. 4.

At 510, the memory device may output a second supply voltage to a memory die of the memory device based on receiving the first supply voltage, the second supply voltage having a second voltage level different than the first voltage level of the first supply voltage. The operations of 510 may be performed according to the methods described herein. In some examples, aspects of the operations of 510 may be performed by a voltage output component as described with reference to FIG. 4.

At 515, the memory device may measure a third voltage level of the second supply voltage at a location on the memory die based on outputting the second supply voltage. The operations of 515 may be performed according to the methods described herein. In some examples, aspects of the operations of 515 may be performed by a voltage measuring component as described with reference to FIG. 4.

At 520, the memory device may output the second supply voltage having a fourth voltage level different than the second voltage level based on measuring the third voltage level at the location on the memory die. The operations of 520 may be performed according to the methods described herein. In some examples, aspects of the operations of 520 may be performed by a voltage output component as described with reference to FIG. 4.

In some examples, an apparatus as described herein may perform a method or methods, such as the method 500. The apparatus may include features, means, or instructions (e.g., a non-transitory computer-readable medium storing instructions executable by a processor) for receiving, by a power management component of a memory device, a first supply voltage having a first voltage level from a memory system, outputting a second supply voltage to a memory die of the memory device based on receiving the first supply voltage, the second supply voltage having a second voltage level different than the first voltage level of the first supply voltage, measuring a third voltage level of the second supply voltage at a location on the memory die based on outputting the second supply voltage, and outputting the second supply voltage having a fourth voltage level different than the second voltage level based on measuring the third voltage level at the location on the memory die.

Some examples of the method 500 and the apparatus described herein may further include operations, features, means, or instructions for determining the fourth voltage level of the second supply voltage based on the third voltage level, where outputting the second supply voltage having the fourth voltage level may be based on determining the fourth voltage level.

Some examples of the method 500 and the apparatus described herein may further include operations, features, means, or instructions for adjusting the second voltage level of the second supply voltage to the fourth voltage level based on measuring the third voltage level, where outputting the second supply voltage having the fourth voltage level may be based on adjusting the second voltage level. In some examples of the method 500 and the apparatus described herein, outputting the second supply voltage may include operations, features, means, or instructions for outputting a set of second supply voltages to the memory die of the memory device based on receiving the first supply voltage, the set of second supply voltages having one or more second voltage levels different than the first voltage level of the first supply voltage, where the set of second supply voltages includes the second supply voltage. In some examples of the method 500 and the apparatus described herein, the power management component may be coupled with a substrate of the memory device and includes at least a portion of a package of the memory device. Some examples of the method 500 and the apparatus described herein may further include operations, features, means, or instructions for measuring the third voltage level may be performed by one or more sensors on the memory die of the memory device.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a substrate, an I/O component coupled with a BGA via the substrate and operable to communicate signals with a host system via the BGA when mounted on a memory module, and one or more memory devices coupled with the substrate and the I/O component and operable to store data for the host system, a memory device of the one or more memory devices including a power management component to provide one or more supply voltages for the memory device based on a power supply from the host system.

Some examples of the apparatus may include a power plane coupled with the one or more memory devices and operable to provide a first voltage to the one or more memory devices, where the power management component of the memory device may be operable to use the first voltage received from the power plane to provide the one or more supply voltages. In some examples, the memory device of the one or more memory devices may include operations, features, means, or instructions for a feedback component operable to measure one or more voltage levels of the one or more supply voltages on at least one memory die of the memory device and adjust at least one voltage level of the one or more supply voltages based on measuring the one or more voltage levels.

In some examples, the memory device of the one or more memory devices includes conductive paths to route the one or more supply voltages provided by the power management component to at least one memory die of the memory device. In some examples, the power management component of the memory device may include operations, features, means, or instructions for a first portion at a first location of the memory device and operable to provide a first subset of the one or more supply voltages, and a second portion at a second location of the memory device and operable to provide a second subset of the one or more supply voltages different than the first subset. In some examples, the power management component of the memory device includes a single integrated circuit in the memory device.

In some examples, the memory device may include operations, features, means, or instructions for a second substrate with the substrate, and a memory die coupled with the second substrate, where the power management component of the memory device may be coupled with the second substrate adjacent to the memory die. In some examples, the memory device may include operations, features, means, or instructions for a second substrate coupled with the substrate, and a memory die coupled with the second substrate, where the power management component of the memory device may be coupled with the memory die, where the memory die may be positioned between the power management component and the second substrate. In some examples, the apparatus does not include a second power management component independent of the power management component on the one or more memory devices.

In some examples, the apparatus includes a DIMM or a SIMM. In some examples, the power management component includes a PMIC. Some examples may further include at least one memory device of the one or more memory devices includes two or more dies of memory cells.

An apparatus is described. The apparatus may include a first substrate coupled with a second substrate of a memory system, one or more memory dies coupled with the first substrate and operable to communicate data via a BGA on the first substrate and corresponding BGA on the first substrate and corresponding BGA pads of the second substrate, and a power management component affixed to the first substrate coupled with the one or more memory dies and operable to provide one or more supply voltages for the one or more memory dies based on one or more voltages associated with the memory system provided via a power delivery network of the second substrate.

Some examples of the apparatus may include a feedback component operable to measure one or more voltage levels of the one or more supply voltages on the one or more memory dies and adjust at least one voltage level of the one or more supply voltages based on measuring the one or more voltage levels. Some examples of the apparatus may include one or more conductive paths to route the one or more supply voltages provided by the power management component to the one or more memory dies.

In some examples, the power management component may include operations, features, means, or instructions for a first portion at a first location and operable to provide a first subset of the one or more supply voltages, and a second portion at a second location and operable to provide a second subset of the one or more supply voltages different than the first subset. In some examples, the power management component includes a single integrated circuit. In some examples, the power management component may be coupled with the first substrate. In some examples, the power management component may be positioned above at least one memory die of the one or more memory dies. In some examples, the power management component receives a first voltage from the memory system and provides the one or more supply voltages based on the first voltage. In some examples, the power management component includes a PMIC.

An apparatus is described. The apparatus may include a memory die for storing data, a power management component coupled with the memory die, and a controller coupled with the memory die and operable to cause the apparatus to receive a first supply voltage having a first voltage level from a memory system, output a second supply voltage to the memory die based on receiving the first supply voltage, the second supply voltage having a second voltage level different than the first voltage level of the first supply voltage, measure a third voltage level of the second supply voltage at a location on the memory die based on outputting the second supply voltage, and output the second supply voltage having a fourth voltage level different than the second voltage level based on measuring the third voltage level at the location on the memory die.

Some examples may further include determining the fourth voltage level of the second supply voltage based on the third voltage level, where outputting the second supply voltage having the fourth voltage level may be based on determining the fourth voltage level. Some examples may further include adjusting the second voltage level of the second supply voltage to the fourth voltage level based on measuring the third voltage level, where outputting the second supply voltage having the fourth voltage level may be based on adjusting the second voltage level. In some examples, the power management component includes at least a portion of a package of the apparatus.

An apparatus is described. The apparatus may include a substrate, an I/O component coupled with a BGA via the substrate and operable to communicate signals with a host system via the BGA when mounted on a memory module, and a set of memory devices coupled with the substrate and the I/O component and operable to store data for the host system, a memory device of the set of memory devices including one or more memory dies including memory cells and a power management component to provide one or more supply voltages for the one or more memory dies based on a power supply from the host system. In some examples, the power management component may be operable to adjust one or more voltage levels of the one or more supply voltages for the one or more memory dies based on voltage levels measured on the one or more memory dies. In some examples, the memory system includes a DIMM or a SIMM.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact." "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a SOI substrate, such as SOG or SOP, or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration." and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B. or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An in-line memory module, comprising:
   a substrate configured to couple with a plurality of dynamic random access memory devices;
   an input/output component coupled with the substrate and operable to communicate signals between a host system and the plurality of dynamic random access memory devices, wherein the substrate includes channels between the plurality of dynamic random access memory devices and the input/output component; and
   a dynamic random access memory device of the plurality of dynamic random access memory devices coupled with the substrate and the input/output component and operable to store data for the host system, the dynamic random access memory device comprising:
   a power management component to receive an input power supply from the host system and output one or more supply voltages for the dynamic random access memory device based at least in part on the input power supply from the host system.

2. The in-line memory module of claim 1, further comprising:
   a power plane coupled with the dynamic random access memory device and operable to provide a first voltage to the dynamic random access memory device, wherein the power management component of the dynamic random access memory device is operable to use the first voltage received from the power plane to provide the one or more supply voltages.

3. The in-line memory module of claim 1, wherein the dynamic random access memory device of the dynamic random access memory device comprises a feedback component operable to measure one or more voltage levels of the one or more supply voltages on at least one memory die of the dynamic random access memory device and adjust at least one voltage level of the one or more supply voltages based at least in part on measuring the one or more voltage levels.

4. The in-line memory module of claim 1, wherein the dynamic random access memory device of the dynamic random access memory device comprises conductive paths to route the one or more supply voltages provided by the power management component to at least one memory die of the dynamic random access memory device.

5. The in-line memory module of claim 1, wherein the power management component of the dynamic random access memory device comprises:
a first portion at a first location of the dynamic random access memory device and operable to provide a first subset of the one or more supply voltages; and
a second portion at a second location of the dynamic random access memory device and operable to provide a second subset of the one or more supply voltages different than the first subset.

6. The in-line memory module of claim 1, wherein the power management component of the dynamic random access memory device comprises a single integrated circuit in the dynamic random access memory device.

7. The in-line memory module of claim 1, wherein the dynamic random access memory device comprises:
a second substrate coupled with the substrate; and
a memory die coupled with the second substrate, wherein the power management component of the dynamic random access memory device is coupled with the second substrate adjacent to the memory die.

8. The in-line memory module of claim 1, wherein the dynamic random access memory device comprises:
a second substrate coupled with the substrate; and
a memory die coupled with the second substrate, wherein the power management component of the dynamic random access memory device is coupled with the memory die, wherein the memory die is positioned between the power management component and the second substrate.

9. The in-line memory module of claim 1, wherein the in-line memory module does not include a second power management component independent of the power management component on the dynamic random access memory device.

10. The in-line memory module of claim 1, wherein the in-line memory module comprises a dual in-line memory module (DIMM) or a single in-line memory module (SIMM).

11. The in-line memory module of claim 1, wherein the power management component comprises a power management integrated circuit (PMIC).

12. The in-line memory module of claim 1, wherein at least one dynamic random access memory device of the dynamic random access memory device comprises two or more dies of memory cells.

13. A dynamic random access memory device, comprising:
a first substrate configured to couple with a second substrate of a dual in-line memory module;
one or more memory dies coupled with the first substrate and operable to communicate data between the first substrate of the dynamic random access memory device and a host system of the second substrate of the dual in-line memory module; and
a power management component affixed to the first substrate coupled with the one or more memory dies and operable to receive one or more input power supplies from the host system and output one or more supply voltages for the one or more memory dies based at least in part on the one or more input power supplies associated with the dual in-line memory module provided via a power delivery network of the second substrate.

14. The dynamic random access memory device of claim 13, further comprising:
a feedback component operable to measure one or more voltage levels of the one or more supply voltages on the one or more memory dies and adjust at least one voltage level of the one or more supply voltages based at least in part on measuring the one or more voltage levels.

15. The dynamic random access memory device of claim 13, further comprising:
one or more conductive paths to route the one or more supply voltages provided by the power management component to the one or more memory dies.

16. The dynamic random access memory device of claim 13, wherein the power management component comprises:
a first portion at a first location and operable to provide a first subset of the one or more supply voltages; and
a second portion at a second location and operable to provide a second subset of the one or more supply voltages different than the first subset.

17. The dynamic random access memory device of claim 13, wherein the power management component comprises a single integrated circuit.

18. The dynamic random access memory device of claim 13, wherein the power management component is coupled with the first substrate.

19. The dynamic random access memory device of claim 13, wherein the power management component is positioned above at least one memory die of the one or more memory dies.

20. The dynamic random access memory device of claim 13, wherein the power management component receives a first voltage from the dual in-line memory module and provides the one or more supply voltages based at least in part on the first voltage.

21. The dynamic random access memory device of claim 13, wherein the power management component comprises a power management integrated circuit (PMIC).

* * * * *